US007120549B2

(12) United States Patent
Lee

(10) Patent No.: US 7,120,549 B2
(45) Date of Patent: Oct. 10, 2006

(54) TEMPERATURE COMPENSATED SELF-REFRESH (TCSR) CIRCUIT HAVING A TEMPERATURE SENSOR LIMITER

(75) Inventor: Kyoung-Ho Lee, Cheongju-si (KR)

(73) Assignee: Hynix Semiconductor Inc., Ichon (KE)

( * ) Notice: Subject to any disclaimer, the term of this patent is extended or adjusted under 35 U.S.C. 154(b) by 35 days.

(21) Appl. No.: 10/875,612

(22) Filed: Jun. 25, 2004
(Under 37 CFR 1.47)

(65) Prior Publication Data

US 2005/0105352 A1 May 19, 2005

(30) Foreign Application Priority Data

Oct. 7, 2003 (KR) ...................... 10-2003-0069499

(51) Int. Cl.
*G01K 15/00* (2006.01)

(52) U.S. Cl. ........................................................ 702/99

(58) Field of Classification Search ................ 702/131, 702/133, 99

See application file for complete search history.

(56) References Cited

U.S. PATENT DOCUMENTS

2005/0125597 A1* 6/2005 Lovett ........................ 711/106

2005/0228611 A1* 10/2005 Kim ........................... 702/130

FOREIGN PATENT DOCUMENTS

KR 100123827 9/1997

* cited by examiner

*Primary Examiner*—John Barlow
*Assistant Examiner*—Demetrius Pretlow
(74) *Attorney, Agent, or Firm*—Mayer, Brown, Rowe and Maw LLP

(57) ABSTRACT

A temperature-compensated self-refresh circuit (TCSR) for use in a semiconductor memory device includes a temperature sensor, which is controlled by a temperature sensor control signal, for outputting a temperature voltage based on a temperature; a voltage comparison unit for comparing a reference voltage with the temperature voltage; a delay unit for delaying a signal outputted from the voltage comparison unit; a control unit for generating the temperature sensor control signal in response to a temperature limit signal and a temperature sensor enable signal and a temperature-compensated refresh cycle signal in response to a delayed signal from the delay unit; and a temperature sensor limiter, which is reset by the refresh cycle signal, for generating the temperature sensor limit signal based on a refresh basic cycle signal and the temperature-compensated refresh cycle signal when the temperature sensor is not used.

20 Claims, 4 Drawing Sheets

TEMPERATURE COMPENSATED SELF-REFRESH (TCSR) CIRCUIT HAVING A TEMPERATURE SENSOR LIMITER

FIELD OF THE INVENTION

The present invention relates to a TCSR (Temperature Compensated Self-refresh) for a semiconductor memory; and, more particularly, to a TCSR having a sensor limiter capable of preventing a refresh cycle from being dropped below a certain degree by providing a predetermined limit in a self-refresh cycle at an ultra low temperature.

DESCRIPTION OF THE RELATED ARTS

Generally, in a portable semiconductor memory apparatus, it is important to decrease a self-refresh current.

In a method for decreasing a self-refresh current, there are a partial array self-refresh (PASR), and a temperature compensated self-refresh (TCSR). In the above conventional PASR and RCSR, a user used them by programming based on EMRS.

In the TCSR, a self-refresh cycle is changed based on a temperature set by a user. Since a data retention time is extended at a low temperature, it is possible to decrease a current consumption by extending a self-refresh cycle.

In the TCSR, a user does not set a temperature outside, but a temperature sensor is provided in the interior of a memory chip, thus automatically adjusting a refresh cycle based on a temperature. The above construction is referred to as an on-die TCSR.

Here, the temperature sensor is operated in such a manner that a current flowing in a diode is changed based on a temperature. Since the current flowing through a diode is low at a low temperature, a refresh cycle is set to be long.

However, in the conventional art, there is a problem that a refresh cycle is limitlessly extended as the temperature is getting closer to a low degree.

For example, the current flowing in a temperature sensor is too low at a low temperature such as 25 degrees below zero, and the cycle of a refresh cycle signal is extended to a degree of 65 μs, and the extended cycle is used as a basic cycle in a self-refresh circuit. In the above state, when a refresh is performed with respect to the whole memory chip parts at a basic cycle in the self-refresh circuit, the total refresh time is about 1 to 2 seconds. Therefore, a memory cell fails to maintain data during a refresh time period, thus losing data.

SUMMARY OF THE INVENTION

It is, therefore, an object of the present invention to provide a temperature compensated self-refresh (TCSR) circuit having a temperature sensor limiter that overcomes the problems encountered in the conventional art.

It is another object of the present invention to provide a temperature compensated self-refresh (TCSR) circuit having a temperature sensor limiter capable of preventing a refresh cycle from being dropped below a certain cycle using a temperature sensor limiter when the temperature is decreased below a certain degree.

To achieve the above objects, there is provided a temperature-compensated self-refresh circuit (TCSR) having a temperature sensor limiter comprising a voltage comparator that compares a reference voltage with a temperature voltage, a delay unit that delays a signal from the voltage comparator, a controller that is controlled by a temperature limit signal and a temperature sensor enable signal and outputs a temperature sensor control signal and outputs a temperature-compensated refresh cycle signal using a signal from the delay unit, a temperature sensor that is controlled by the temperature sensor control signal and outputs a temperature voltage based on the temperature using a diode, and a temperature sensor limiter that is reset by the refresh cycle signal and outputs a temperature sensor limit signal that the refresh basic cycle signal is divided when the temperature sensor is not used.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

Hereinafter, a semiconductor device in accordance with the present invention will be described in detail referring to the accompanying drawings.

Figure 1:
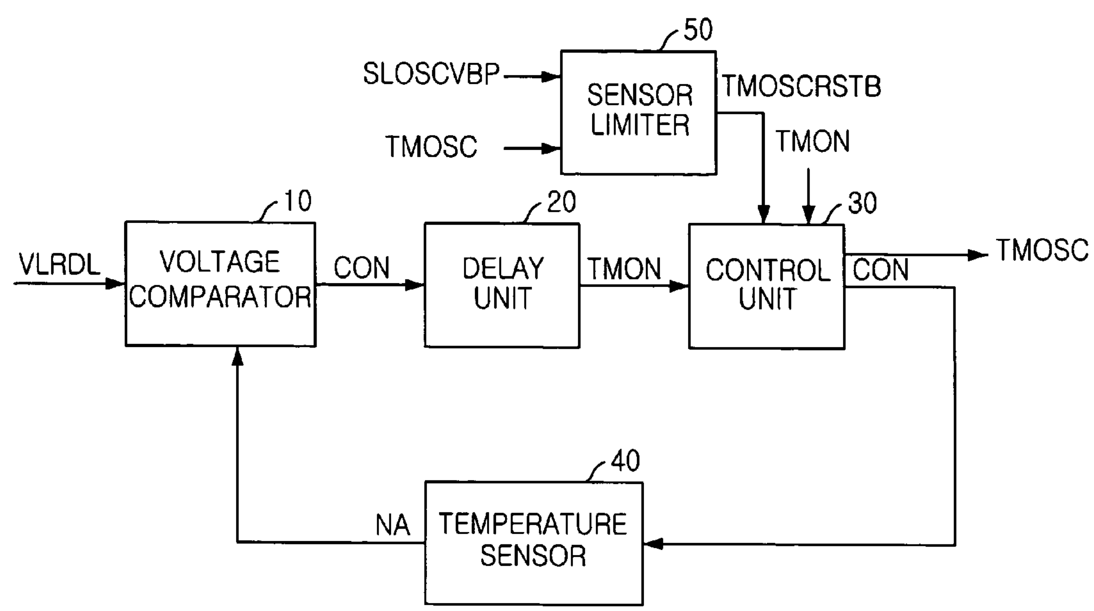
FIG. 1 is a block diagram illustrating a TCSR (Temperature Compensated Self-Refresh) according to the present invention.

FIG. 1 is a block diagram of a TCSR according to the present invention. Here, the TCSR according to the present invention includes a voltage comparator 10 that compares a reference voltage REF with a temperature voltage NA from a temperature sensor 40, a delay unit 20 that delays a signal COM from the voltage comparator 10, a controller 30 that is controlled by a temperature sensor limit signal TMOSCRSTB and a temperature sensor enable signal TMON and outputs a temperature control signal CON and outputs a temperature-compensated refresh signal TMOSC using a signal DCOM from the delay unit 20, a temperature sensor 40 that is controlled by a temperature sensor control signal CON from the controller 30 and outputs a temperature voltage NA based on a temperature, and a sensor limiter 50 that outputs a temperature sensor limit signal TMOSCRSTB using a refresh basic cycle signal SLOSCVBP used in a basic cycle generator of a self-refresh when the temperature sensor 40 is not used and a temperature-compensated refresh signal TMOSC.

Figure 2:
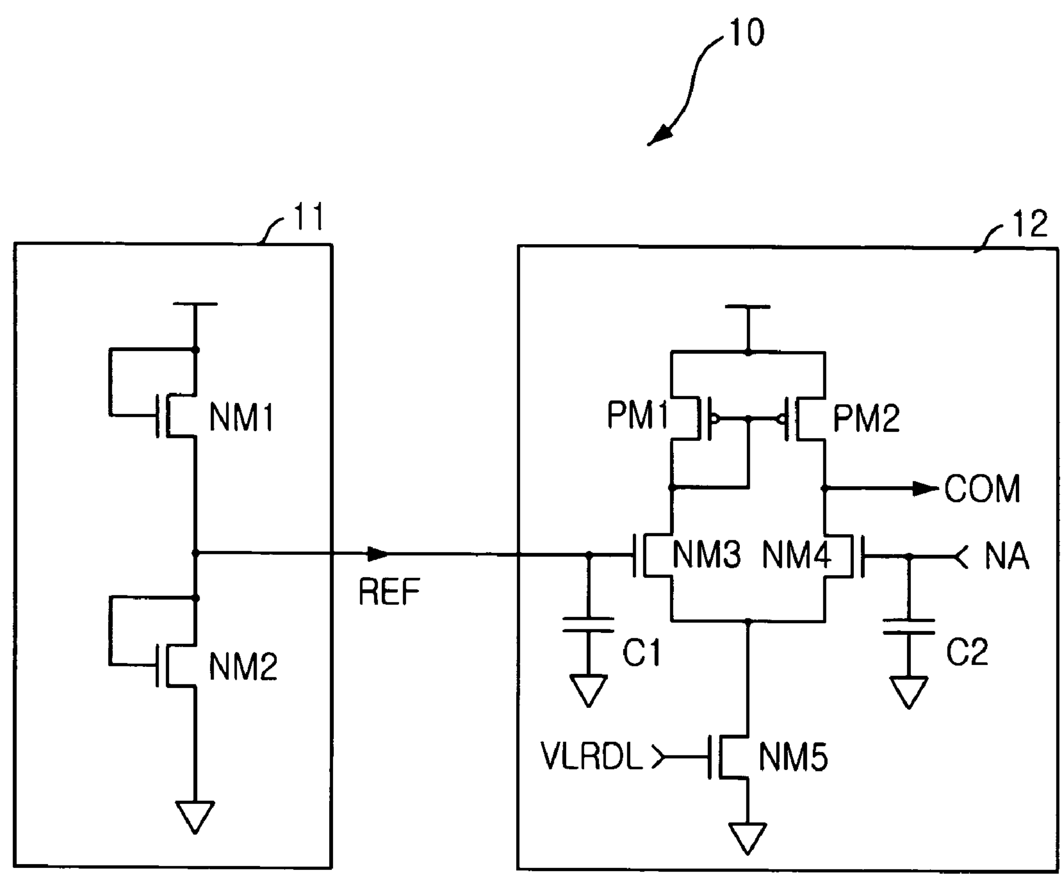
FIG. 2 is a detailed circuit diagram illustrating a voltage comparator in the TCSR of FIG. 1 according to the present invention.

FIG. 2 is a detailed circuit diagram of a voltage comparator 10 in the TCSR of FIG. 1 according to the present invention.

The voltage comparator 10 includes a reference voltage generator 11 that divides a power voltage VDD and generates a reference voltage REF, and a comparator 12 that compares a reference voltage REF with a temperature voltage NA from the temperature sensor 40.

The reference voltage generator 11 includes two NMOS transistors NM1 and NM2 resistor-connected between a power voltage VDD and a ground voltage VSS in series. A reference voltage REF is outputted from a common node of the NMOS transistors NM1 and NM2.

The comparator 12 includes PMOS transistors PM1 and PM2 connected in a current mirror type, NMOS transistors NM3 and NM4 in which a reference voltage REF and a temperature voltage NA are applied to each gate of the same, and the sources of the same are commonly connected with each other, and the drains of the same are connected with the drains of the PMOS transistors PM1 and PM2, respectively, and a NMOS transistor NM5 in which a drain of the same is connected with a common source of the NMOS transistors NM3 and NM4, and a source of the same is connected with a ground voltage VSS. Here, capacitors C1 and C2 are connected with the gates of the NMOS transistors NM3 and NM3, respectively.

Figure 3:
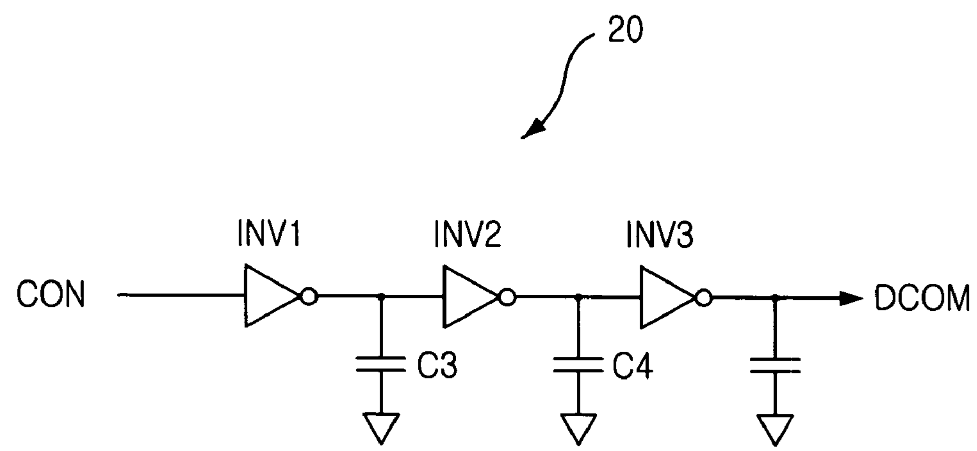
FIG. 3 is a detailed circuit diagram of a delay unit in the TCSR of FIG. 1 according to the present invention.
Figure 4:
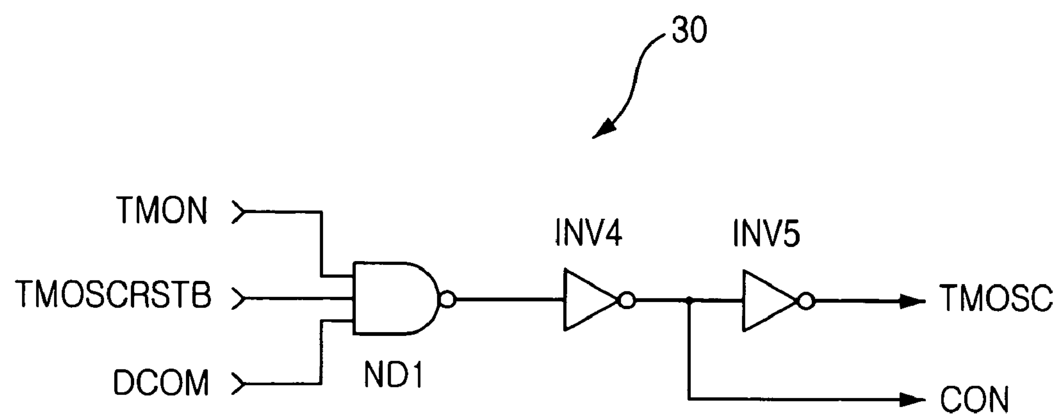
FIG. 4 is a detailed circuit diagram illustrating a controller in the TCSR of FIG. 1 according to the present invention.

FIG. 3 is a detailed circuit diagram of a delay unit 20 of the TCSR of FIG. 1 according to the present invention.

As shown therein, the delay unit 20 includes inverters INV1, INV2 and INV3 connected between an input terminal and an output terminal in series, and capacitors C3, C4 and C5 connected with each output terminal of the inverters INV1, INV2, and INV3.

Here, the controller 30 includes a NAND gate ND1 that NANDs a temperature sensor enable signal TMON, a temperature sensor limit signal TMOSCRSTB and a signal DCOM from the delay unit 20, respectively, an inverter INV4 for inverting a signal from the NAND gate ND1 and outputting a temperature sensor control signal CON, and an inverter INV5 for inverting a signal from the inverter INV4 and outputting a temperature-compensated refresh cycle signal TMOSC.

Figure 5:
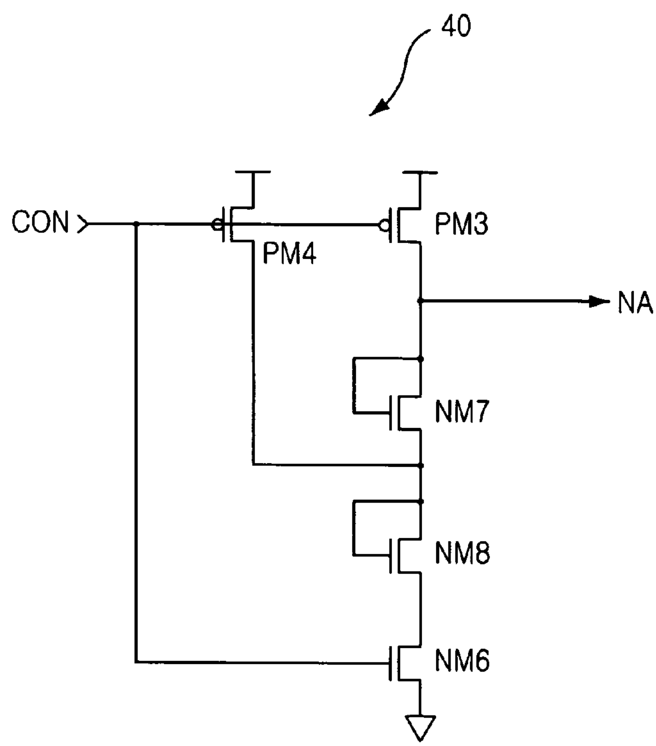
FIG. 5 is a detailed circuit diagram illustrating a temperature sensor in the TCSR of FIG. 1 according to the present invention.

FIG. 5 is a detailed circuit diagram of a temperature sensor 40 of the TCSR of FIG. 1 according to the present invention.

As shown therein, the temperature sensor 40 includes PMOS transistors PM3 and PM4 and NMOS transistor NM6 that are controlled by a temperature sensor control signal CON, and NMOS transistors NM7 and NM8 that are diode-connected between the output terminal NA and the NMOS transistor NM6 in series. Here, the drain of the PMOS transistor PM4 is connected with a common node of the diode-connected NMOS transistors NM7 and NM8.

Figure 6:
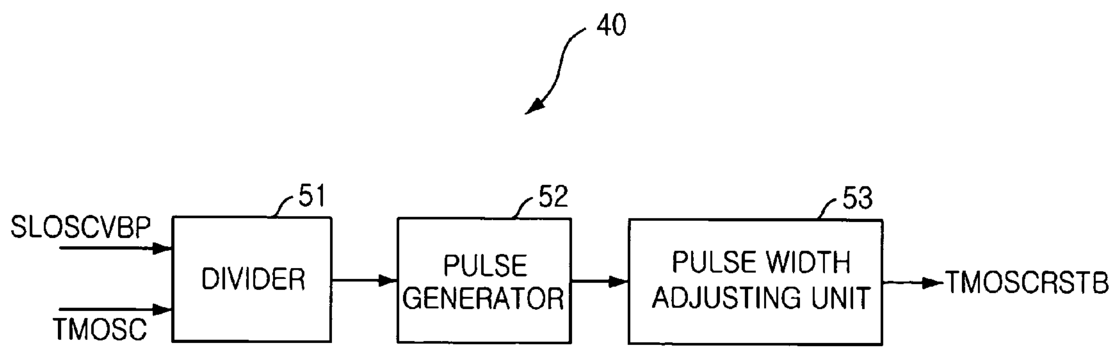
FIG. 6 is a detailed block diagram illustrating a temperature sensor limiter in the TCSR of FIG. 1 according to the present invention.

FIG. 6 is a detailed block diagram of a temperature sensor limiter 50 in the TCSR of FIG. 1 according to the present invention.

As shown therein, the temperature sensor limiter 50 includes a divider 51 that divides a refresh basic cycle signal SLOSCVBP used for a basic cycle generator of a self-refresh circuit when a temperature sensor 40 controlled by a temperature-compensated refresh cycle signal TMOSC is not used, a pulse generator 52 that generates a pulse using a signal from the divider 51, and a pulse width adjusting unit 53 that outputs a temperature sensor limit signal TMOSCRSTB by adjusting a pulse width of a pulse from the pulse generator 52. In the above embodiment of the present invention, the dividing ratio of the divider 51 was 8-divides. In another embodiment of the present invention, the dividing ratio may be changed based on a design of the system.

The present invention is basically directed to a method of forcibly generating a refresh cycle signal using a temperature sensor limit signal TMOSCRSTB that is a pulse signal having a certain cycle in the case that a temperature-compensated refresh cycle signal TMOSC is not generated within a cycle of a pulse signal.

Here, the temperature sensor limit signal TMOSCRSTB is a pulse signal having a constant cycle obtained by dividing a refresh basic cycle signal SLOSCVBP used for a self-refresh basic cycle generator.

At this time, when the temperature sensor limit signal TMOSCRSTB becomes a low pulse, the refresh cycle signal TMOSC becomes a high pulse.

In addition, when a refresh cycle signal TMOSC is generated, a temperature sensor limit signal TMOSCRSTB is not generated by resetting the divider 51 of the temperature sensor limiter 50 using a refresh cycle signal TMOSC.

The operations of the TCSR according to the present invention will be described in more detail with reference to FIGS. 1 to 6.

The voltage comparator 10 compares a reference voltage REF with an electric potential NA by a voltage drop generating by a diode current of the temperature sensor 40. If the reference voltage REF is larger, an output signal COM becomes a high level. Here, in the reference voltage REF, the power voltage VDD is divided based on a resistance ratio of two NMOS transistors NM1 and NM2 having a resistance role of the reference voltage generator 11. For example, if the sizes of two NMOS transistors NM1 and NM2 are same, the reference voltage REF has a half value of the power voltage VDD.

The signal COM from the voltage comparator 10 is delayed by the delay unit 20 for obtaining a charging and discharging time of the capacitors C1 and C2 used in the voltage comparator 10.

The controller 30 generates a signal CON used for controlling the temperature sensor 40 in response with a signal TMON enabling the temperature sensor 40. In the case that the signal is a low level, a temperature-compensated refresh cycle signal TMOSC is not generated, and the signal remains a high level.

The temperature sensor 40 is a temperature sensor using a diode. The current flowing in a MOS diode has a certain function of the temperature. At this time, the current degree is decreased, as the temperature is decreased when the gate source voltage VGS is within about 3 volts.

Therefore, the output node NA becomes a high level when an enable signal TMON is a low level, thus charging the capacitor C1 of the voltage comparator 10.

When the enable signal TMON is a high level, the PMOS transistors PM3 and PM4 are turned off, so that the capacitor C1 is discharged. At this time, the voltage drop is determined based on the current flowing in the NMOS diode NM7. Namely, at a high temperature, since the current flowing in the NMOS diode NM7 is high, the voltage drop of the output node NA occurs fast. At a low temperature, since the current flowing in the NMOS diode NM7 is low, the voltage drop of the output node NA occurs slowly.

When the electric potential of the output node NA of the temperature sensor 40 is lower than the reference voltage REF, the output COM of the voltage comparator 10 is a high level, and the PMOS transistors PM3 and PM4 of the temperature sensor are turned on, and the refresh cycle signal TMOSC becomes a high level.

When the PMOS transistors PM3 and PM4 of the temperature sensor 40 are turned on, and the output node NA becomes a high level, the capacitor C1 of the voltage comparator 10 is charged, and a signal COM from the voltage comparator 10 becomes a low level, and the PMOS transistors PM3 and PM4 of the temperature sensor 40 are turned off, so that the refresh cycle signal TMOSC becomes a low level again.

The above operations are repeatedly performed. The refresh cycle signal TMOSC is changed to a pulse signal having a cycle determined based on the degree of the current flowing through the NMOS diode NM7 of the temperature sensor 40.

At this time, at a low temperature, even when the electric potential of the output node NA is not enough dropped because the degree of the current flowing in the NMOS diode NM7 of the temperature sensor 40 is low, the temperature sensor 40 is reset after a certain time period is passed, this generating a refresh cycle signal TMOSC.

Namely, when a temperature sensor limit signal TMOSCRSTB that is a pulse signal having a constant cycle applied to the controller 30 is a low pulse, even when the electric potential NA of the output node of the temperature sensor 40 is higher than the reference voltage REF, the refresh cycle signal TMOSC becomes a high level, and the PMOS transistors PM3 and PM4 of the temperature sensor 40 are turned on, and the output node NA becomes a high level.

Here, the refresh basic cycle signal SLOSVBP used in a basic cycle generator of the self-refresh is divided and used as a temperature sensor limit signal PMOSCRSTB when the temperature sensor 40 is not used.

Namely, the refresh basic cycle signal SLOSVBP having a cycle of about 3~4 μs is divided into 8 parts, thus generating a temperature sensor limit signal TMOSCRSTB having a cycle of about 25~30 μs.

At this time, when the refresh cycle signal TMOSC occurs again, the divider 51 of the temperature sensor limiter 50 is reset, and the temperature sensor limit signal TMOSCRSTB does not occur any more.

As described above, in the temperature-compensated self-refresh circuit using a temperature sensor limiter according to the present invention, it is possible to prevent any loss of data that may occur as the refresh cycle is extended below a certain cycle at an ultra low temperature.

The present application contains subject matter related to Korean patent application No. 2003-69499, filed in the Korean Patent Office on Oct. 7, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A temperature-compensated self-refresh circuit (TCSR) for use in a semiconductor memory device, comprising:

a temperature sensor, which is controlled by a temperature sensor control signal, for outputting a temperature voltage based on a temperature;

a voltage comparison means for comparing a reference voltage with the temperature voltage;

a delay means for delaying a signal outputted from the voltage comparison means;

a control means for generating the temperature sensor control signal in response to a temperature limit signal and a temperature sensor enable signal and a temperature-compensated refresh cycle signal in response to a delayed signal from the delay means; and a temperature sensor limiter, which is reset by the refresh cycle signal, for generating the temperature sensor limit signal based on a refresh basic cycle signal and the temperature-compensated refresh cycle signal when the temperature sensor is not used.

2. The temperature-compensated self-refresh circuit as recited in claim 1, wherein the voltage comparison means includes:

a reference voltage generation means for generating the reference voltage by dividing a power voltage; and a comparison means for comparing the reference voltage with the temperature voltage.

3. The temperature-compensated self-refresh circuit as recited in claim 2, wherein the comparison means is constituted with a differential amplifier.

4. The temperature-compensated self-refresh circuit as recited in claim 3, wherein the comparison means includes:

a plurality of PMOS transistors connected in a current mirror type;

a plurality of NMOS transistors in which the reference voltage and the temperature voltage are applied to the gates of the same, respectively, and the sources of the same are commonly connected with each other, and the drains of the same are connected with the drains of the PMOS transistors, respectively; and a NMOS transistor in which an enable signal is applied to a gate of the same, and a drain of the same is connected with the common sources of the NMOS transistors, and a source of the same is connected with a ground.

5. The temperature-compensated self-refresh circuit as recited in claim 4, wherein a capacitor is coupled to the gates of the NMOS transistors respectively.

6. The temperature-compensated self-refresh circuit as recited in claim 2, wherein the reference voltage generation means includes a plurality of MOS transistors resistor-serially connected between a power voltage and a ground voltage.

7. The temperature-compensated self-refresh circuit as recited in claim 1, wherein the delay means includes:

a plurality of inverters connected between the input terminal and the output terminal in series; and a plurality of capacitors connected with each output terminal of the inverters, respectively.

8. The temperature-compensated self-refresh circuit as recited in claim 1, wherein the control means includes:

a NAND gate for performing a NAND operation on the temperature sensor enable signal, the temperature sensor limit signal and the signal outputted from the delay means;

a first inverter for inverting a signal outputted from the NAND gate to thereby generate the temperature sensor control signal; and a second inverter for inverting a signal outputted from the inverter to thereby output the temperature-compensated refresh cycle signal.

9. The temperature-compensated self-refresh circuit as recited in claim 1, wherein the temperature sensor includes:

first and second PMOS transistors and a first NMOS transistor which are controlled by the temperature sensor control signal; and second and third NMOS transistors which is diode-connected between the output terminal and the first NMOS transistor, wherein the drain of the first PMOS transistor is connected with the common node of the second and third NMOS transistors that are diode-connected.

10. The temperature-compensated self-refresh circuit as recited in claim 1, wherein the temperature sensor limiter includes:

a divider, which is controlled by a refresh cycle signal, for dividing the refresh basic cycle signal by a predetermined ratio;

a pulse generator for generating a pulse using a signal outputted from the divider; and a pulse width adjusting unit for adjusting a pulse width of the pulse outputted from the pulse generator and generating an adjusted pulse as the temperature sensor limit signal.

11. A semiconductor memory device, comprising:

a control means for generating the temperature sensor control signal in response to a temperature limit signal and a temperature sensor enable signal and a temperature-compensated refresh cycle signal in response to an input signal controlled based on a temperature; and a temperature sensor limiter, which is reset by the refresh cycle signal, for generating the temperature sensor limit signal based on a refresh basic cycle signal and the temperature-compensated refresh cycle signal when the temperature sensor is not used.

12. The semiconductor memory device as recited in claim 11, further comprising:

a temperature sensor, which is controlled by a temperature sensor control signal, for outputting a temperature voltage based on the temperature;

a voltage comparison means for comparing a reference voltage with the temperature voltage to generate the input signal.

13. The semiconductor memory device as recited in claim 12, further comprising a delay means for delaying the input signal outputted from the voltage comparison means.

14. The semiconductor memory device as recited in claim 13, wherein the voltage comparison means includes:

a reference voltage generation means for generating the reference voltage by dividing a power voltage; and a comparison means for comparing the reference voltage with the temperature voltage.

15. The semiconductor memory device as recited in claim 14, wherein the comparison means is constituted with a differential amplifier.

16. The semiconductor memory device as recited in claim 14, wherein the reference voltage generation means includes a plurality of MOS transistors resistor-serially connected between a power voltage and a ground voltage.

17. The semiconductor memory device as recited in claim 13, wherein the delay means includes:

a plurality of inverters connected between the input terminal and the output terminal in series; and a plurality of capacitors connected with each output terminal of the inverters, respectively.

18. The semiconductor memory device as recited in claim 13, wherein the control means includes:

a NAND gate for performing a NAND operation on the temperature sensor enable signal, the temperature sensor limit signal and the signal outputted from the delay means;

a first inverter for inverting a signal outputted from the NAND gate to thereby generate the temperature sensor control signal; and a second inverter for inverting a signal outputted from the inverter to thereby output the temperature-compensated refresh cycle signal.

19. The semiconductor memory device as recited in claim 13, wherein the temperature sensor includes:

first and second PMOS transistors and a first NMOS transistor which are controlled by the temperature sensor control signal; and second and third NMOS transistors which is diode-connected between the output terminal and the first NMOS transistor, wherein the drain of the first PMOS transistor is connected with the common node of the second and third NMOS transistors that are diode-connected.

20. The semiconductor memory device as recited in claim 13, wherein the temperature sensor limiter includes:

a divider, which is controlled by a refresh cycle signal, for dividing the refresh basic cycle signal by a predetermined ratio;

a pulse generator for generating a pulse using a signal outputted from the divider; and a pulse width adjusting unit for adjusting a pulse width of the pulse outputted from the pulse generator and generating an adjusted pulse as the temperature sensor limit signal.

* * * * *